(12) United States Patent
Utsumi et al.

(10) Patent No.: US 6,603,194 B2
(45) Date of Patent: Aug. 5, 2003

(54) LEAD FRAME AND METHOD FOR FABRICATING RESIN-ENCAPSULATED SEMICONDUCTOR DEVICE USING THE SAME

(75) Inventors: Masaki Utsumi, Moriguchi (JP); Masashi Funakoshi, Takatsuki (JP); Tsuyoshi Hamatani, Otsu (JP); Takeshi Morikawa, Moriyama (JP); Yukio Nakabayashi, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/879,082

(22) Filed: Jun. 13, 2001

(65) Prior Publication Data

US 2002/0109973 A1 Aug. 15, 2002

(30) Foreign Application Priority Data

Feb. 15, 2001 (JP) ........................................ 2000-038220

(51) Int. Cl.[7] ............................................. H01L 23/495
(52) U.S. Cl. ...................... 257/667; 257/666; 257/670; 438/123; 438/124
(58) Field of Search ................................. 257/667, 666, 257/670; 438/124, 123

(56) References Cited

U.S. PATENT DOCUMENTS

| | | | | | |
|---|---|---|---|---|---|
| 6,163,069 | A | * | 12/2000 | Oohira et al. | 257/675 |
| 6,198,163 | B1 | * | 3/2001 | Crowley et al. | 257/675 |
| 6,400,004 | B1 | * | 6/2002 | Fan et al. | 257/666 |
| 6,424,024 | B1 | * | 7/2002 | Shih et al. | 257/667 |

\* cited by examiner

*Primary Examiner*—David L. Talbott
(74) *Attorney, Agent, or Firm*—Nixon Peabody LLP; Donald R. Studebaker

(57) ABSTRACT

A lead frame includes: an outer frame section; a plurality of chip mounting sections which are supported by the outer frame section and on which a plurality of semiconductor chips are mounted; lead sections surrounding the chip mounting sections; connecting sections for connecting and supporting the lead sections and the outer frame section with each other; and an encapsulation region in which the chip mounting sections are encapsulated together in an encapsulation resin. An opening is provided in a plurality of regions of the outer frame section that are each located outside the encapsulation region and along the extension of one of the connecting sections.

13 Claims, 11 Drawing Sheets

LEAD FRAME AND METHOD FOR FABRICATING RESIN-ENCAPSULATED SEMICONDUCTOR DEVICE USING THE SAME

BACKGROUND OF THE INVENTION

The present invention relates to a lead frame such that the lead frame is exposed on the bottom surface after it is encapsulated in a resin, and a method for fabricating a resin-encapsulated semiconductor device that can be surface-mounted on a substrate, using such a lead frame.

In recent years, there is an increasing demand for high-density mounting of semiconductor elements in order to realize smaller electronic devices with higher functionalities. Accordingly, the overall size and the thickness of a resin-encapsulated semiconductor device (a device obtained by integrally encapsulating a semiconductor chip and leads in a resin mold) have been quickly reduced. Moreover, various techniques have been developed in order to reduce the production cost and to increase the productivity.

A conventional method for fabricating a resin-encapsulated semiconductor device will now be described with reference to FIG. 11.

FIG. 11 illustrates a conventional method for fabricating a resin-encapsulated semiconductor device. More specifically, FIG. 11 is a cross-sectional view illustrating a step of separating a plurality of semiconductor devices resin-encapsulated onto a lead frame from one another. As illustrated in FIG. 11, a lead frame 101, on which a plurality of semiconductor devices 100 are individually encapsulated in a resin, is held on a dicing sheet 200, and then the lead frame 101 is cut by a cutting blade 201 along a cut region extending between adjacent semiconductor devices 100. A burr 101a (a rough edge remaining after cutting the lead frame 101) may be produced on the end surface (the cut surface) of the lead frame 101 after being cut by the cutting blade 201.

The burr 101a occurring on the bottom surface of the semiconductor device 100 is undesirable. If the semiconductor device 100 is a surface-mounted device in which the leads are exposed on the bottom surface thereof, the adherence between the semiconductor device 100 and the substrate on which it is mounted may be insufficient due to the burr 101a, thereby making the electrical connection therebetween imperfect.

While diamond powder, or the like, is typically applied on the cutting surface of the cutting blade 201, the cutting surface is likely to be loaded with metal powder as the cutting blade 201 is repeatedly used to cut the lead frame 101, which is made of a metal. Once the cutting blade 201 is loaded, the cutting process cannot be continued with the loaded cutting blade 201, and it is necessary to replace the loaded cutting blade 201 with a new blade. Such a replacement process reduces the productivity.

SUMMARY OF THE INVENTION

The present invention has been made to solve the these problems in the prior art, and has an object to reduce the burr occurring on the cut surface of a lead frame, thereby improving the quality of a resin-encapsulated semiconductor device while prolonging the life of a cutting blade, thus improving the productivity.

In order to achieve this object, the present invention provides a lead frame made of a metal and having cut regions along which the lead frame is cut into a plurality of semiconductor devices, wherein the cut regions are partially depressed to reduce the amount of metal existing along the cut regions. When fabricating a resin-encapsulated semiconductor device, the depressed portion of each cut region of the lead frame may be filled with an encapsulation resin.

Specifically, a first lead frame according to the present invention includes: an outer frame section; a plurality of chip mounting sections which are supported by the outer frame section and on which a plurality of semiconductor chips are mounted; lead sections surrounding the chip mounting sections; connecting sections for connecting and supporting the lead sections and the outer frame section with each other; and an encapsulation region in which the chip mounting sections are encapsulated together in an encapsulation resin, wherein an opening is provided in a plurality of regions of the outer frame section that are each located outside the encapsulation region and along an extension of one of the connecting sections.

In the first lead frame, an opening is provided in a plurality of regions of the outer frame section that are each located outside the encapsulation region and along an extension of one of the connecting sections. Therefore, when the lead frame is cut by a cutting blade along the connecting sections, the amount of the lead frame to be cut by the cutting blade is reduced in a portion of the outer frame section that is outside the encapsulation region. In this way, it is possible to reduce the occurrence of a burr of the lead frame and to suppress the loading of the cutting blade, thereby improving the quality of the resin-encapsulated semiconductor device while prolonging the life of the cutting blade, thus improving the productivity.

In the first lead frame, it is preferred that a width of the opening is greater than a thickness of cutting means for cutting the lead frame along the connecting sections. In this way, the cutting means does not contact the lead frame in the openings, thereby reliably suppressing the occurrence of a burr of the lead frame and the loading of the cutting means.

A second lead frame according to the present invention includes: an outer frame section; a plurality of chip mounting sections which are supported by the outer frame section and on which a plurality of semiconductor chips are mounted; lead sections surrounding the chip mounting sections; connecting sections for connecting and supporting the lead sections and the outer frame section with each other; and an encapsulation region in which the chip mounting sections are encapsulated together in an encapsulation resin, wherein a depressed portion is provided in a plurality of regions of the outer frame section that are each located outside the encapsulation region, on a reverse side of a runner section along which the encapsulation resin flows, and along an extension of one of the connecting sections.

In the second lead frame, a depressed portion is provided in a plurality of regions of the outer frame section that are each located outside the encapsulation region, on a reverse side of a runner section along which the encapsulation resin flows, and along an extension of one of the connecting sections. Therefore, when the lead frame is cut by a cutting blade along the connecting sections, the amount of the lead frame to be cut by the cutting blade is reduced in a portion of the outer frame section that is outside the encapsulation region. In this way, it is possible to reduce the occurrence of a burr of the lead frame and to suppress the loading of the cutting blade. In addition, the depressed portion may be filled with an encapsulation resin. Since an encapsulation resin is typically mixed with silica (silicon oxide) as a filler, there is provided a so-called "dressing effect" of recovering the cutting blade, etc., from a loaded state by the silica component mixed in the encapsulation resin. As a result, the occurrence of a burr is reduced, thereby improving the quality of the resin-encapsulated semiconductor device, while the life of the cutting blade can be prolonged by the dress effect provided by the silica component.

In the second lead frame, it is preferred that a width of the depressed portion is greater than a thickness of cutting means for cutting the lead frame along the connecting sections. In this way, the cutting means does not contact the lead frame in the depressed portions, and the cutting means instead contacts the encapsulation resin, thereby suppressing the occurrence of a burr of the lead frame while further improving the dressing effect on the cutting means.

In the first or second lead frame, it is preferred that each of the connecting sections includes a thinned portion whose thickness is smaller than a thickness of the outer frame section. In this way, the thickness of the encapsulation resin is increased above or below the connecting sections. Therefore, when the lead frame is cut by a cutting blade along the connecting sections, the amount of the lead frame to be cut by the cutting blade is reduced while the amount of the encapsulation resin to be cut by the cutting blade is increased, thereby reducing the burr of the lead frame and improving the dressing effect on the cutting blade.

In the first or second lead frame, it is preferred that another opening is provided in a plurality of regions of a peripheral portion of the encapsulation region that are each located along an extension of one of the connecting sections. In this way, since the other openings are located within the encapsulation region of the lead frame, the other openings are filled with the encapsulation resin, thereby further improving the dressing effect on the cutting blade.

In the first or second lead frame, it is preferred that a width of each of the connecting sections is smaller than a thickness of cutting means for cutting the lead frame along the connecting sections. In this way, when cutting the lead frame along the connecting sections into a plurality of devices, the cutting means can cut away the connecting sections completely. In addition, the alignment margin of the cutting means with respect to the connecting section is increased.

In such a case, it is further preferred that each of the connecting sections is chamfered near the lead sections, thereby reducing a thickness of the connecting section near the lead sections. This further reduces the amount of the lead frame to be cut by the cutting blade while increasing the amount of the encapsulation resin to be cut by the cutting blade, thereby reducing the burr of the lead frame and improving the dressing effect on the cutting blade.

A first method for fabricating a resin-encapsulated semiconductor device according to the present invention includes: a first step of providing a lead frame, the lead frame including: an outer frame section; a plurality of chip mounting sections which are supported by the outer frame section and on which a plurality of semiconductor chips are mounted; lead sections surrounding the chip mounting sections; connecting sections for connecting and supporting the lead sections and the outer frame section with each other; and an encapsulation region in which the chip mounting sections are encapsulated together in an encapsulation resin, wherein an opening is provided in a plurality of regions of the outer frame section that are each located outside the encapsulation region and along an extension of one of the connecting sections, and each of the connecting sections includes a thinned portion; a second step of mounting a plurality of semiconductor chips respectively on the chip mounting sections of the lead frame; a third step of electrically connecting each of the mounted semiconductor chips to the lead sections surrounding the semiconductor chip; a fourth step of integrally encapsulating the lead frame and semiconductor chips in an encapsulation resin; and a fifth step of cutting the encapsulated lead frame by using a cutting blade along the connecting sections so as to obtain a plurality of semiconductor devices each having at least one of the semiconductor chips included in the encapsulation resin, wherein the fourth step includes a step of encapsulating the lead frame and semiconductor chips so that a depression defined above or below each of the thinned portions of the lead frame is filled with the encapsulation resin.

The first method for fabricating a resin-encapsulated semiconductor device uses the first lead frame of the present invention, wherein each of the connecting sections includes a thinned portion, and the depression defined above or below the thinned portion is filled with an encapsulation resin. Thus, the thickness of the encapsulation resin is increased above or below the connecting sections. Therefore, the amount of the lead frame to be cut by the cutting blade is reduced while the amount of the encapsulation resin to be cut by the cutting blade is increased. As a result, the burr of the lead frame is reduced and the dressing effect on the cutting blade is improved, thereby improving the quality of the resin-encapsulated semiconductor device while prolonging the life of the cutting blade, thus improving the productivity.

A second method for fabricating a resin-encapsulated semiconductor device according to the present invention includes: a first step of providing a lead frame, the lead frame including: an outer frame section; a plurality of chip mounting sections which are supported by the outer frame section and on which a plurality of semiconductor chips are mounted; lead sections surrounding the chip mounting sections; connecting sections for connecting and supporting the lead sections and the outer frame section with each other; and an encapsulation region in which the chip mounting sections are encapsulated together in an encapsulation resin, wherein a depressed portion is provided in a plurality of regions of the outer frame section that are each located outside the encapsulation region, on a reverse side of a runner section along which the encapsulation resin flows, and along an extension of one of the connecting sections, and each of the connecting sections includes a thinned portion; a second step of mounting a plurality of semiconductor chips respectively on the chip mounting sections of the lead frame; a third step of electrically connecting each of the mounted semiconductor chips to the lead sections surrounding the semiconductor chip; a fourth step of integrally encapsulating the lead frame and semiconductor chips in an encapsulation resin; and a fifth step of cutting the encapsulated lead frame by using a cutting blade along the connecting sections so as to obtain a plurality of semiconductor devices each having at least one of the semiconductor chips included in the encapsulation resin, wherein the fourth step includes a step of encapsulating the lead frame and semiconductor chips so that a depression defined above or below each of the thinned portions of the lead frame is filled with the encapsulation resin.

The second method for fabricating a resin-encapsulated semiconductor device uses the second lead frame of the present invention, wherein each of the connecting sections includes a thinned portion, and the depression defined above or below the thinned portion is filled with an encapsulation resin. As a result, the second method for fabricating a resin-encapsulated semiconductor device of the present invention also provides effects as those provided by the first method of the present invention.

A third method for fabricating a resin-encapsulated semiconductor device according to the present invention includes: a first step of providing a lead frame, the lead frame including: an outer frame section; a plurality of chip mounting sections which are supported by the outer frame section and on which a plurality of semiconductor chips are mounted; lead sections surrounding the chip mounting sections; connecting sections for connecting and supporting the lead sections and the outer frame section with each other; and an encapsulation region in which the chip mounting sections are encapsulated together in an encapsulation resin, wherein a depressed portion is provided in a plurality of regions of the outer frame section that are each located outside the encapsulation region, on a reverse side of a runner section along which the encapsulation resin flows, and along an extension of one of the connecting sections; a second step of mounting a plurality of semiconductor chips respectively on the chip mounting sections of the lead frame; a third step of electrically connecting each of the mounted semiconductor chips to the lead sections surrounding the semiconductor chip; a fourth step of integrally encapsulating the lead frame and semiconductor chips in an encapsulation resin; and a fifth step of cutting the encapsulated lead frame by using a cutting blade along the connecting sections so as to obtain a plurality of semiconductor devices each having at least one of the semiconductor chips included in the encapsulation resin, wherein the fourth step includes a step of encapsulating the lead frame and semiconductor chips so that the depressed portions of the lead frame are not filled with the encapsulation resin.

The third method for fabricating a resin-encapsulated semiconductor device uses the second lead frame of the present invention, whereby the amount of the lead frame to be cut by the cutting means is reduced. As a result, the burr of the lead frame is reduced and the loading of the cutting means is reduced, thereby improving the quality of the resin-encapsulated semiconductor device while prolonging the life of the cutting blade, thus improving the productivity. Moreover, since the depressed portions provided in the runner section are not filled with the encapsulation resin, the depressed portions can be structurally simplified.

A fourth method for fabricating a resin-encapsulated semiconductor device according to the present invention includes: a first step of providing a lead frame, the lead frame including: an outer frame section; a plurality of chip mounting sections which are supported by the outer frame section and on which a plurality of semiconductor chips are mounted; lead sections surrounding the chip mounting sections; connecting sections for connecting and supporting the lead sections and the outer frame section with each other; and an encapsulation region in which the chip mounting sections are encapsulated together in an encapsulation resin, wherein a depressed portion is provided in a plurality of regions of the outer frame section that are each located outside the encapsulation region, on a reverse side of a runner section along which the encapsulation resin flows, and along an extension of one of the connecting sections; a second step of mounting a plurality of semiconductor chips respectively on the chip mounting sections of the lead frame; a third step of electrically connecting each of the mounted semiconductor chips to the lead sections surrounding the semiconductor chip; a fourth step of integrally encapsulating the lead frame and semiconductor chips in an encapsulation resin; and a fifth step of cutting the encapsulated lead frame by using a cutting blade along the connecting sections so as to obtain a plurality of semiconductor devices each having at least one of the semiconductor chips included in the encapsulation resin, wherein the fourth step includes a step of encapsulating the lead frame and semiconductor chips so that the depressed portions of the lead frame are filled with the encapsulation resin.

The fourth method for fabricating a resin-encapsulated semiconductor device uses the second lead frame of the present invention, wherein the depressed portions of the lead frame are filled with the encapsulation resin. Therefore, the amount of the lead frame to be cut by the cutting means is reduced while the amount of the encapsulation resin to be cut by the cutting means is increased. As a result, the burr of the lead frame is reduced and the dressing effect on the cutting blade is improved, thereby improving the quality of the resin-encapsulated semiconductor device while prolonging the life of the cutting blade, thus improving the productivity.

DETAILED DESCRIPTION OF THE INVENTION

The present inventors have conducted various studies on a method for obtaining resin-encapsulated semiconductor devices by cutting a single lead frame, onto which a plurality of semiconductor devices have been resin-encapsulated, by using cutting means such as a cutting blade (dicing blade). More specifically, the present inventors have conducted various studies on how to suppress a burr produced by the use of a blade and how to improve the productivity which can be reduced by loading of the blade. As a result, the present inventors have obtained the following findings.

Figure 1:
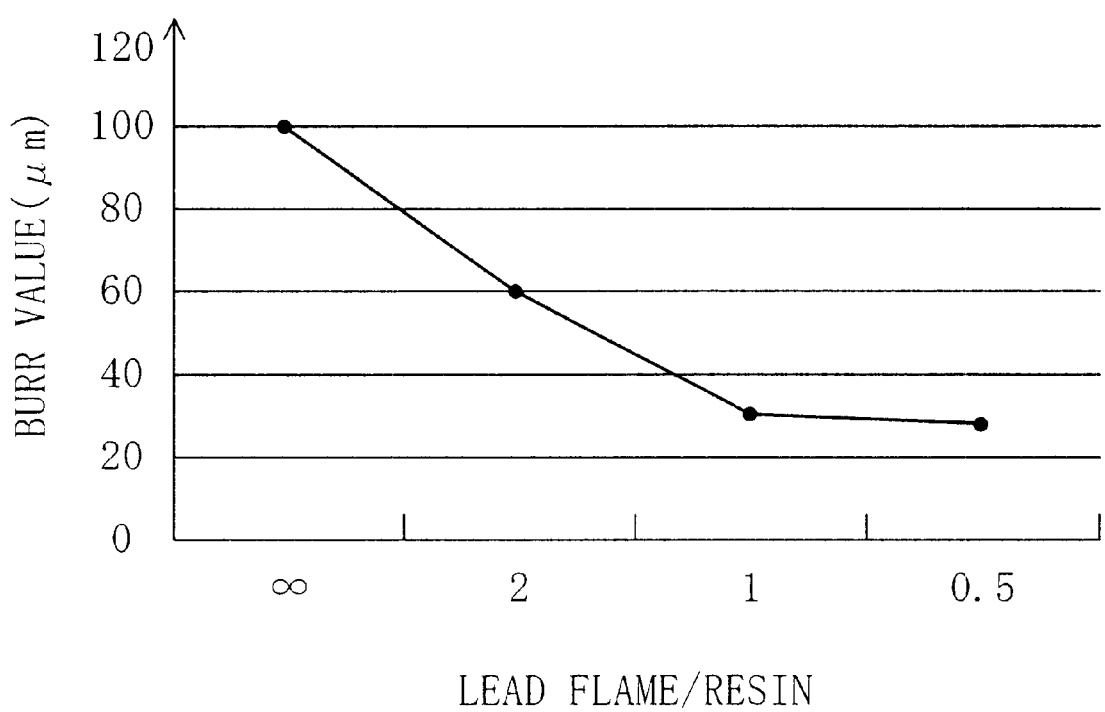
FIG. 1 is a graph illustrating the relationship between the ratio of a lead frame thickness with respect to an encapsulation resin thickness and the height of a burr occurring in the cutting process according to the present invention.

FIG. 1 illustrates the relationship between the ratio of the lead frame thickness with respect to the encapsulation resin thickness and the burr value, i.e., the height of burrs produced in the cutting process. Herein, the lead frame is made of a cupper (Cu) alloy, the cutting blade has a thickness of 0.1 mm to 0.9 mm, and the width of the cut portion of the lead frame is 0.11 mm to 0.99 mm. The cutting conditions are as follows. The feed speed of the cutting blade is about 10 mm/s to about 100 mm/s, the speed of rotation thereof is about 10000 rpm to 60000 rpm, the flow rate of cooling and lubricating water is about 0.7 L/min to about 1.7 L/min, and the thickness of the lead frame is about 0.2 mm.

As illustrated in FIG. 1, when cutting a lead frame solely with no encapsulation resin, the burr height is as large as 100 μm, which is one half of the thickness of the lead frame. In contrast, when cutting a lead frame together with an encapsulation resin, with the ratio of the lead frame thickness with respect to the encapsulation resin thickness being 2 (i.e., when the thickness of the encapsulation resin is one half of that of the lead frame), the burr height is reduced to 60 μm. When the ratio is 1 (i.e., when the thickness of the encapsulation resin is substantially equal to that of the lead frame), the burr height is further reduced to about 33 μm. Moreover, when the ratio is 0.5 (i.e., when the thickness of the encapsulation resin is twice that of the lead frame), the burr height is further reduced to about 28 μm.

This shows that by cutting a lead frame together with an encapsulation resin whose thickness is substantially equal to, or about twice as large as, that of the lead frame, the height of a burr produced in the lead frame can be reduced by a factor of 3 or more, as compared to when cutting the lead frame solely.

One embodiment of the present invention will now be described with reference to the drawings.

Figure 2:
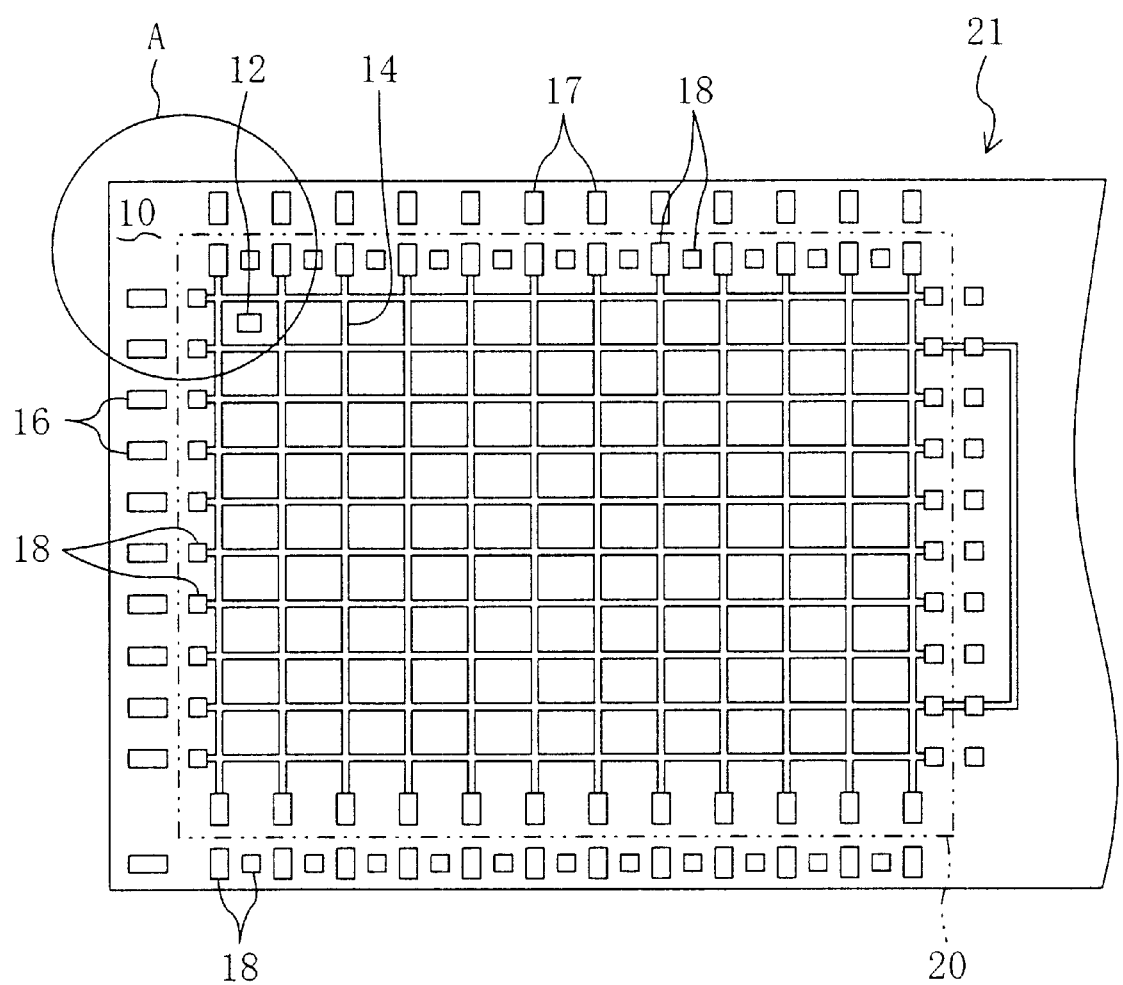
FIG. 2 is a partial bottom view schematically illustrating a lead frame according to one embodiment of the present invention.
Figure 3:
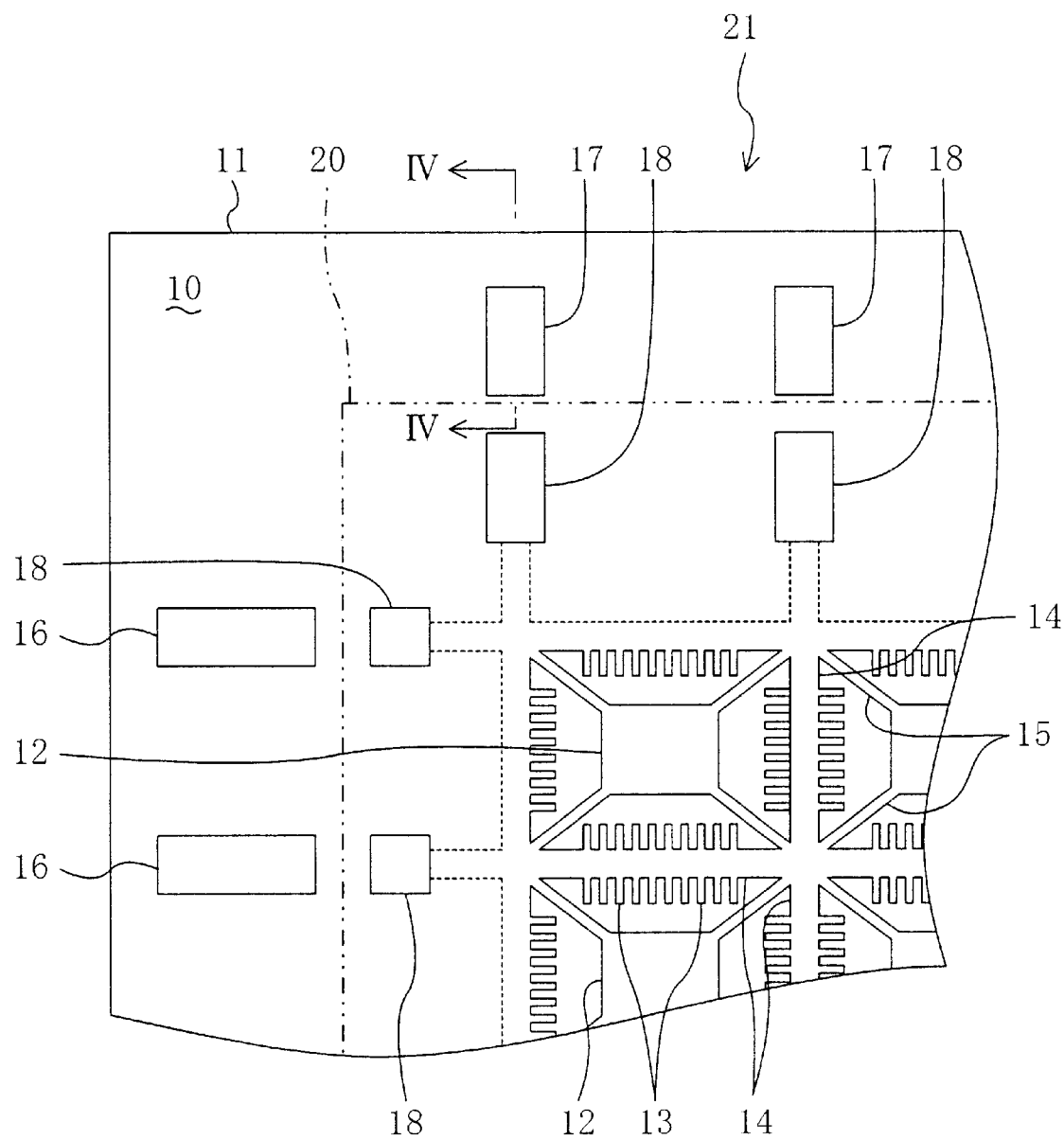
FIG. 3 is an enlarged bottom view illustrating a part of the lead frame illustrated in FIG. 2.

FIG. 2 is a partial bottom view schematically illustrating a lead frame according to one embodiment of the present invention, and FIG. 3 is a detailed bottom view illustrating an enlarged view of region A shown in FIG. 2.

As illustrated in FIG. 2 or FIG. 3, a lead frame 10 having a thickness of about 0.2 mm and made of a cupper alloy or an iron/nickel (Fe/Ni) alloy includes: an outer frame section 11; chip mounting (die pad) sections 12 which are supported by the outer frame section 11 and on which a plurality of semiconductor chips are mounted; inner lead sections 13 surrounding the chip mounting sections 12; connecting sections 14 for connecting and supporting the inner lead sections 13 and the outer frame section 11 with each other; and suspension lead sections 15 for connecting and supporting the chip mounting sections 12 and the outer frame section 11 with each other. The chip mounting sections 12 are arranged within an encapsulation region 20 which is to be encapsulated by an encapsulation resin.

First openings (slits) 16 are provided each in a region of the outer frame section 11 that is outside the encapsulation region 20 and along the extension of one of the connecting sections 14. The first opening 16 has a width that is greater than the thickness of the cutting blade.

A runner section 21, along which an encapsulation resin having a fluidity flows, is provided in a region of the upper surface of the outer frame section 11 that is outside the encapsulation region 20. Depressed portions 17 are provided each in a region on the reverse (rear) side of the runner section 21 that is along the extension of one of the connecting sections 14. The depressed portion 17 has a width that is greater than the thickness of the cutting blade. The first opening 16 and the depressed portion 17 differ from each other in that the former is a through hole running through the lead frame 10 while the latter does not run completely through the lead frame 10. If an opening (through hole) is provided in the runner section 21, the encapsulation resin flows through the opening, whereby the encapsulation resin will be cured on both sides of the lead frame 10 while being connected together through the opening. In such a case, the resin in the runner section 21 cannot be easily removed. Moreover, if an opening (through hole) is provided in the runner section 21, the encapsulation resin will flow into the first opening 16, thereby disturbing the balance of the resin flow. This may lead to a void, an unfilled portion, etc., occurring in the semiconductor device, thereby lowering the encapsulating/molding property.

Second openings 18 are provided each in a region of a peripheral portion of the encapsulation region 20 that is along the extension of one of the connecting sections 14. The second opening 18 has a width that is greater than the thickness of the cutting blade.

Figure 4A:
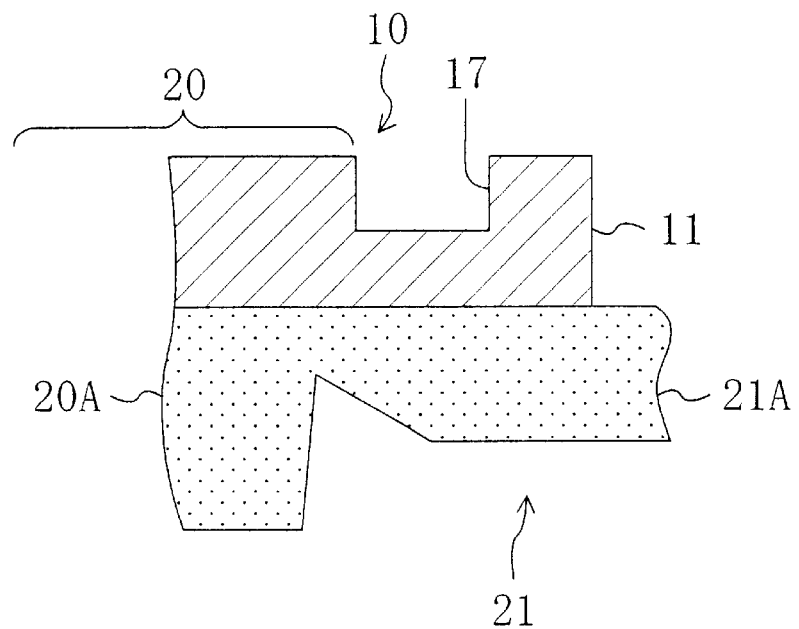
FIG. 4A is a cross-sectional view taken along line IV—IV of FIG. 3, illustrating a part of the lead frame after being encapsulated in a resin.

FIG. 4A is a cross-sectional view taken along line IV—IV of FIG. 3, illustrating a part of the lead frame 10 after being encapsulated in a resin. As illustrated in FIG. 4A, an encapsulation resin portion 20A is formed in the encapsulation region 20, and a runner encapsulation resin portion 21A is formed in the runner section 21. The depressed portion 17 is formed by, for example, a half etching process to a depth of about 0.07 mm to about 0.14 mm, while the thickness of the runner encapsulation resin portion 21A is about 0.6 mm.

As described above, the depressed portion 17 is provided in a region of the runner section 21 of the outer frame section 11 of the lead frame 10 that is along the extension of the connecting section 14, and the first opening 16 is provided in a region of the outer frame section 11 other than the runner section 21 that is along the extension of the connecting section 14. In this way, in a portion of the outer frame section 11 outside the encapsulation region 20, the amount of the lead frame 10 to be cut by the cutting blade can be reduced. As a result, the occurrence of a burr of the lead frame 10 is reduced, and the loading of the cutting blade can also be suppressed, thereby improving the quality of the resin-encapsulated semiconductor device while prolonging the life of the cutting blade, thus improving the productivity.

Figure 4B:
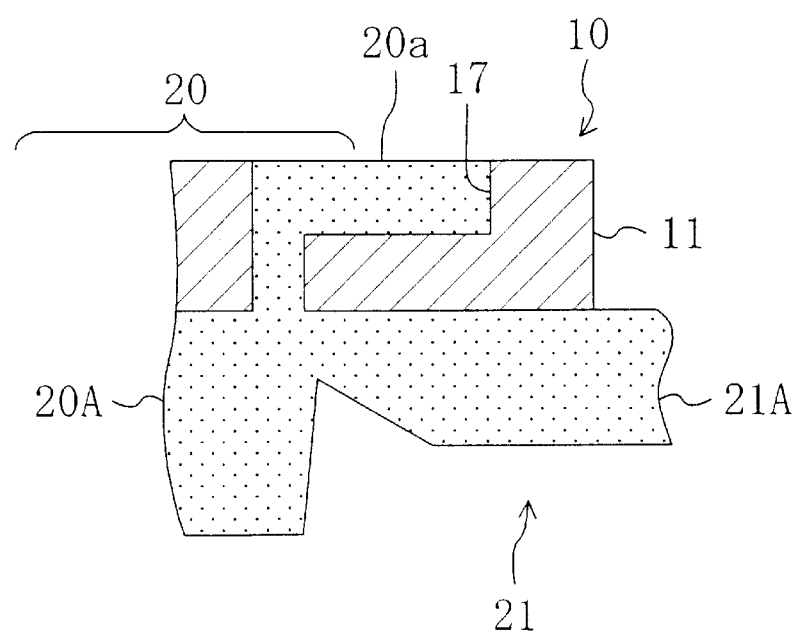
FIG. 4B is a cross-sectional view taken along line IV—IV of FIG. 3, illustrating a variation of the embodiment of the present invention.

FIG. 4B is a cross-sectional view taken along line IV—IV of FIG. 3, illustrating a variation of the depressed portion 17 after the lead frame 10 is encapsulated in a resin. As illustrated in FIG. 4B, the depressed portion 17 of the variation is formed so that it can be filled with an encapsulation resin 20a. In this way, it is possible to reduce the amount of the lead frame 10 to be cut by the cutting blade while increasing the amount of the encapsulation resin to be cut by the cutting blade, thereby improving the dressing effect on the cutting blade.

Note that the depressed portion 17 illustrated in FIG. 4B requires an arrangement for connecting the encapsulation resin portion 20A or the runner encapsulation resin portion 21A to the depressed portion 17, i.e., a passageway therebetween for the encapsulation resin 20a, so that it can be filled with the encapsulation resin 20a. In this regard, the lead frame 10 of FIG. 4A having the depressed portion 17 which is not filled with a resin is structurally simpler than that of FIG. 4B.

A method for fabricating a resin-encapsulated semiconductor device using a lead frame having such a structure as described above will now be described with reference to FIG. 5A and FIG. 5B.

The first step is to provide the lead frame 10 as illustrated in FIG. 3, in which the first opening 16 is provided in a region of the outer frame section 11 that is outside the encapsulation region 20 and along the extension of the connecting section 14, while the depressed portion 17 is provided in a region on the reverse side of the runner section 21 that is along the extension of the connecting section 14, with the connecting section 14 being thinned generally along the center line thereof so as to define a thinned portion 14a and a depression above the thinned portion 14a.

Figure 5A:
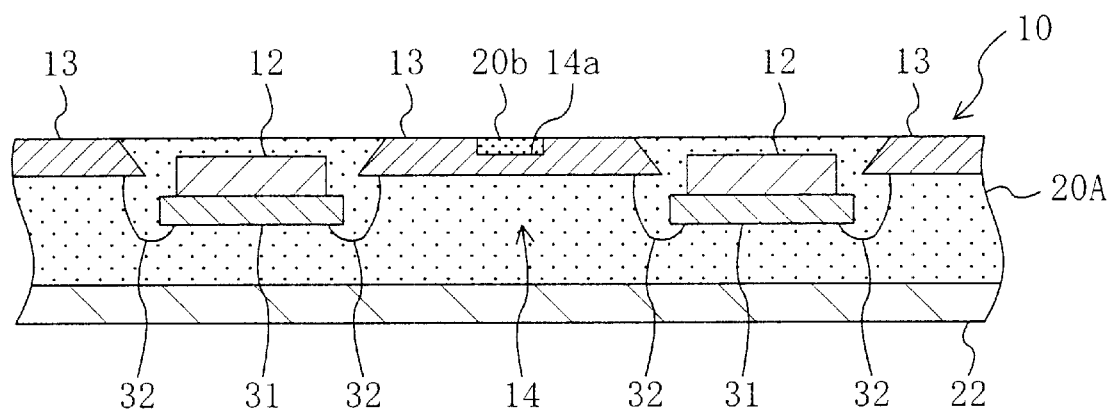
FIG. 5A and FIG. 5B are cross-sectional views sequentially illustrating two steps in a method for fabricating a resin-encapsulated semiconductor device using a lead frame according to one embodiment of the present invention.

Then, as illustrated in FIG. 5A, a semiconductor chip 31 is mounted on each of the chip mounting sections 12, and the mounted semiconductor chip 31 is connected by thin metal lines 32 to the inner lead sections 13 surrounding the semiconductor chip 31. Then, the inner lead sections 13, the chip mounting sections 12, the semiconductor chips 31 and the thin metal lines 32 are integrally encapsulated in an encapsulation resin so that the bottom surface of each inner lead section 13 is exposed, thereby forming the encapsulation resin portion 20A. Note that the bottom surface of the lead frame 10 is facing up in this step.

Then, the resin-encapsulated lead frame 10 is held on a dicing sheet (UV sheet) 22, with the chip-mounted side of the encapsulation resin portion 20A facing the dicing sheet 22. Note that the lead frame 10 may alternatively be held on the dicing sheet 22, with the other side opposite to the chip-mounted side facing the dicing sheet 22.

Figure 5B:
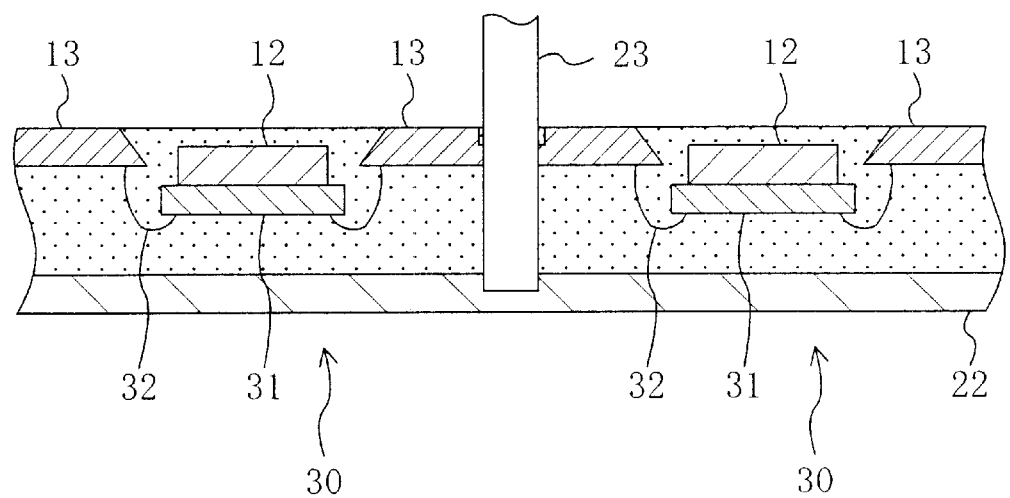

Then, as illustrated in FIG. 5B, the lead frame 10 held on the dicing sheet 22 is cut under the cutting conditions as described above by using a cutting blade 23 along the connecting sections 14 so as to obtain a plurality of semiconductor devices 30 each having at least one of the semiconductor chips 31 included in the encapsulation resin portion 20A.

During the cutting step, since the depression defined above the thinned portion 14a is filled with an encapsulation resin 20b, the loading of the cutting blade 23 can be suppressed, and the dressing effect on the cutting blade 23 can be improved.

The connecting section 14 of the lead frame 10 according to the present embodiment, the thinned portion 14a of the connecting section 14, and the depressed portion 17, will now be described in greater detail with reference to the drawings.

Figure 6:
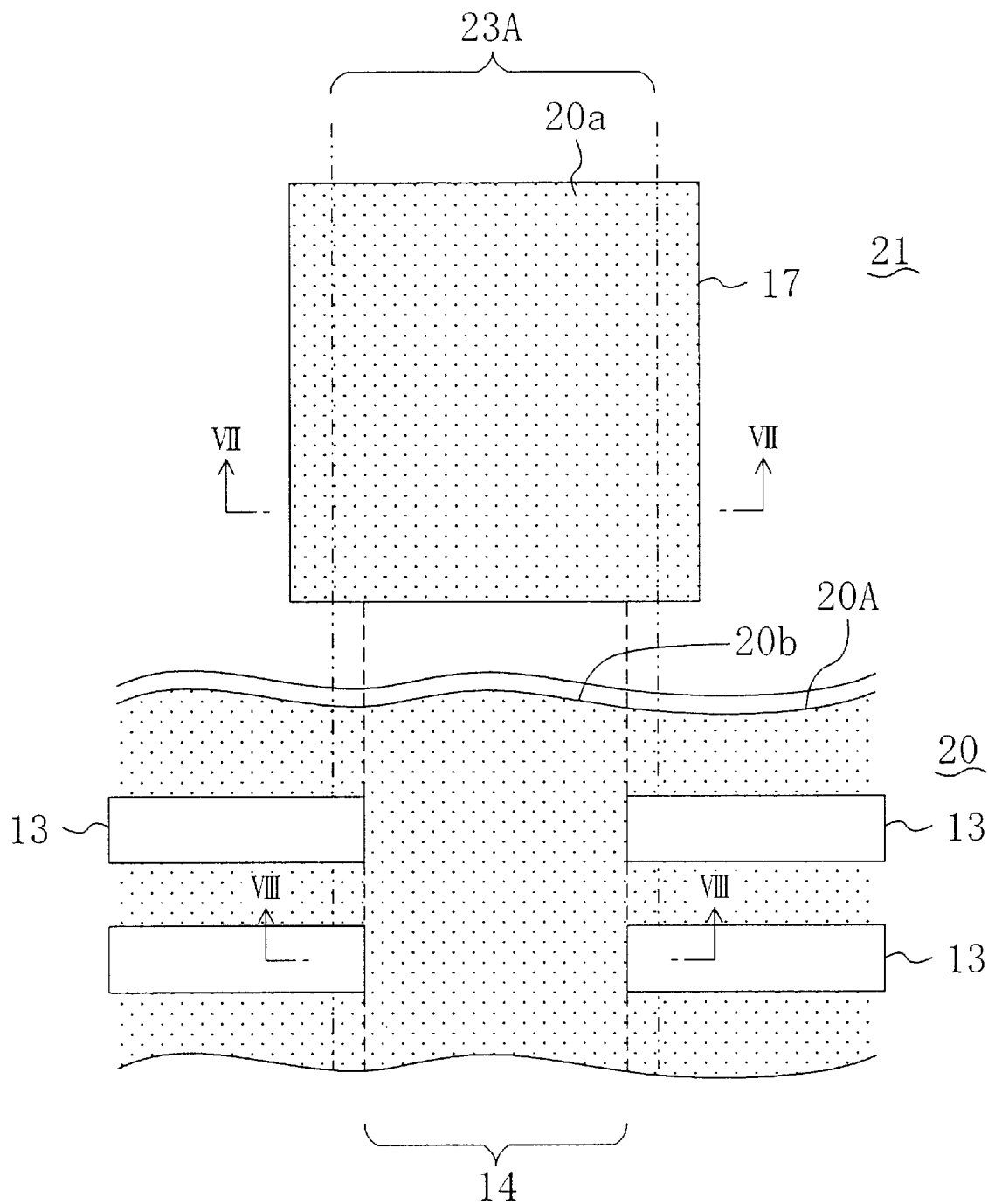
FIG. 6 is a partial bottom view illustrating a cut region of a lead frame according to one embodiment of the present invention.
Figure 7:
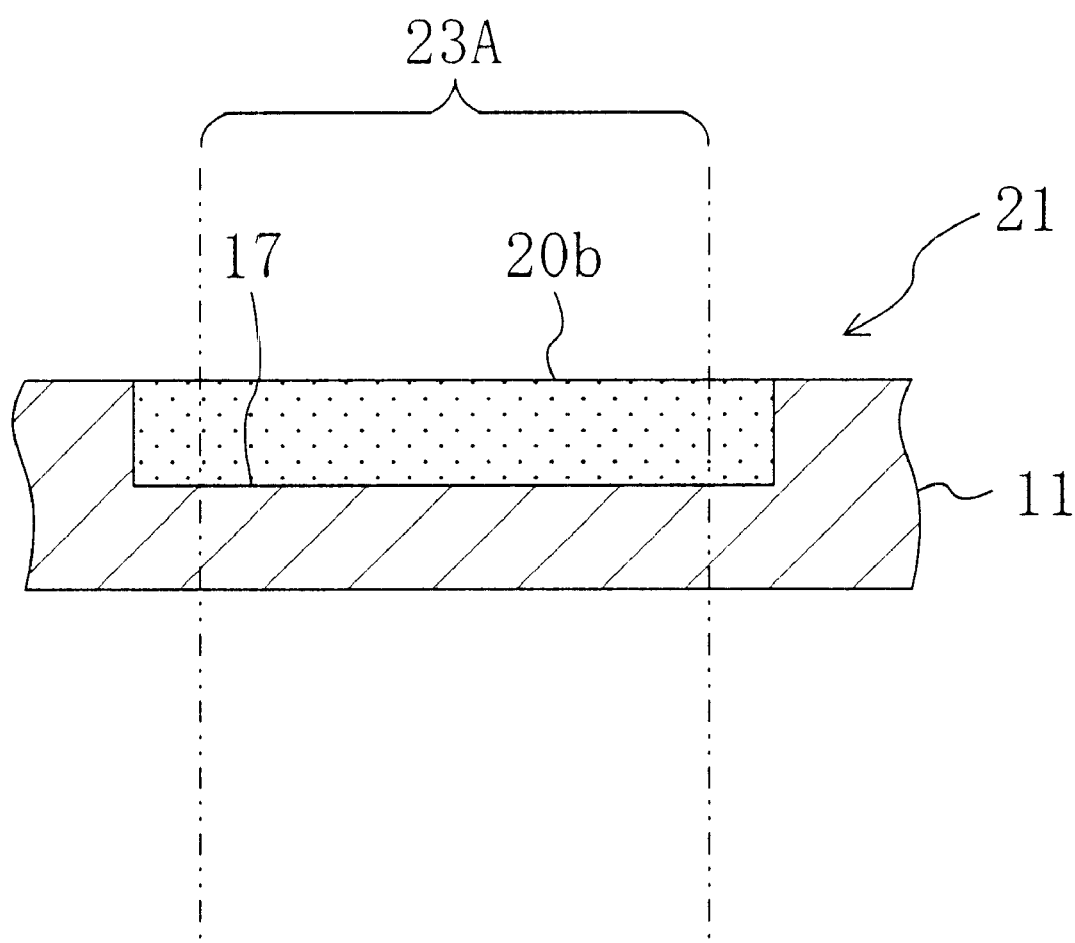
FIG. 7 is a cross-sectional view taken along line VII—VII of FIG. 6, illustrating a depressed portion.

FIG. 6 illustrates the bottom surface of the lead frame 10 after it is encapsulated in a resin. Specifically, FIG. 6 illustrates the encapsulation region 20, and the depressed portion 17 provided in a region of the runner section 21 that is located along the extension of the connecting section 14. FIG. 7 is a cross-sectional view taken along line VII—VII of FIG. 6, illustrating the depressed portion 17, and FIG. 8 is a cross-sectional view taken along line VIII—VIII of FIG. 6, illustrating the connecting section 14 and the inner lead section 13.

As illustrated in FIG. 6 and FIG. 7, the width of the depressed portion 17 is set to be greater than the width of a cut region 23A to be cut by the cutting blade. In this way, it is possible reduce the amount of the lead frame 10 to be cut while increasing the amount of the encapsulation resin 20a to be cut, thereby suppressing the amount of burr on the cut surface of the lead frame 10 and also improving the dressing effect on the cutting blade. Although not shown in these figures, the width of the first opening 16 and the width of the second opening 18 are also set to be greater than the width of the cut region 23A.

Figure 8:
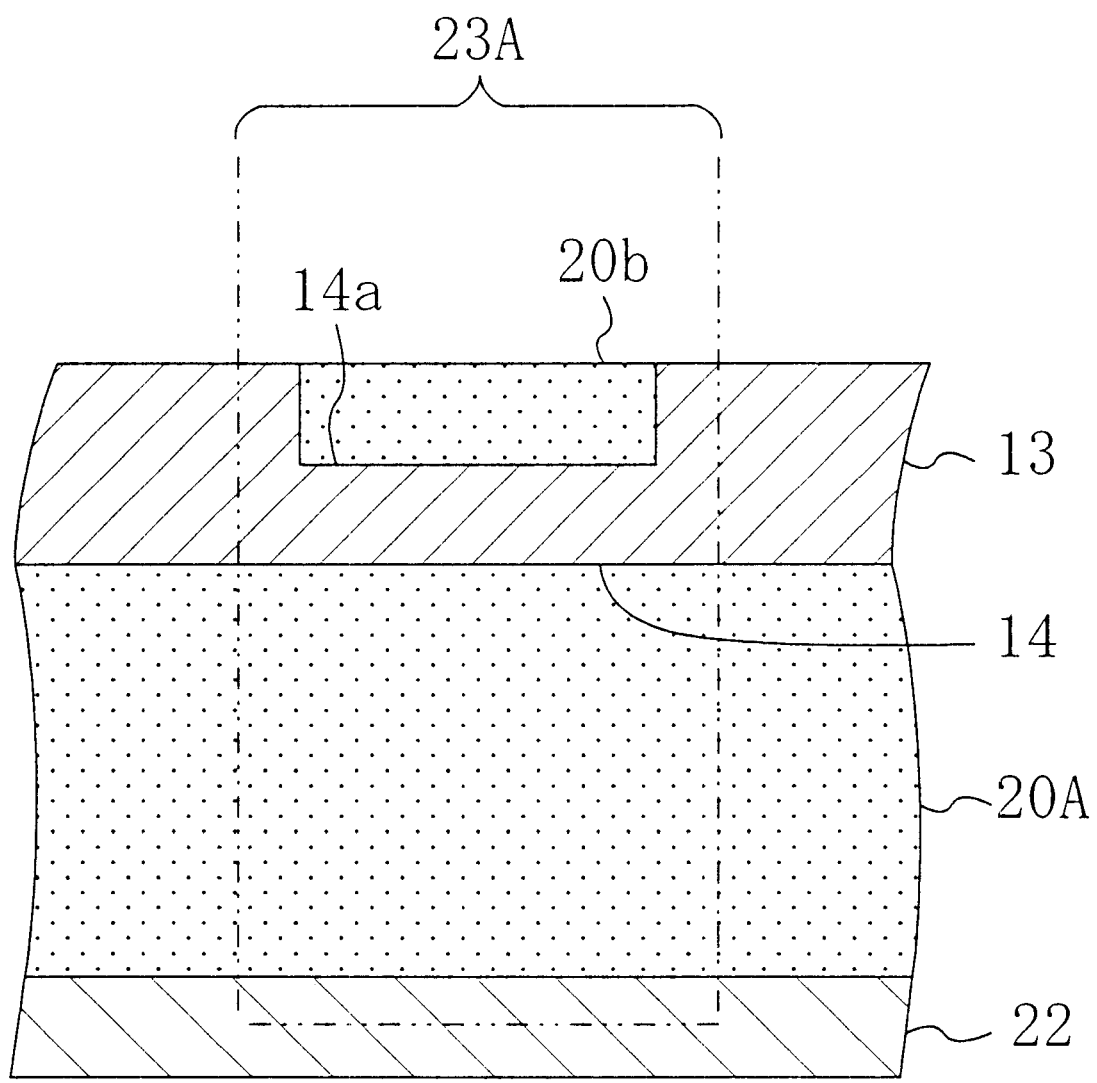
FIG. 8 is a cross-sectional view taken along line VIII—VIII of FIG. 6, illustrating a connecting section and an inner lead section.

Moreover, as illustrated in FIG. 6 and FIG. 8, the width of the connecting section 14 is set to be less than the width of the cut region 23A to be cut by the cutting blade. This ensures that when the lead frame 10 is cut along the connecting section 14, the cutting blade cuts away the connecting section 14 completely. It also increases the alignment margin of the cutting blade with respect to the connecting section 14, thereby improving the productivity.

Figure 9:
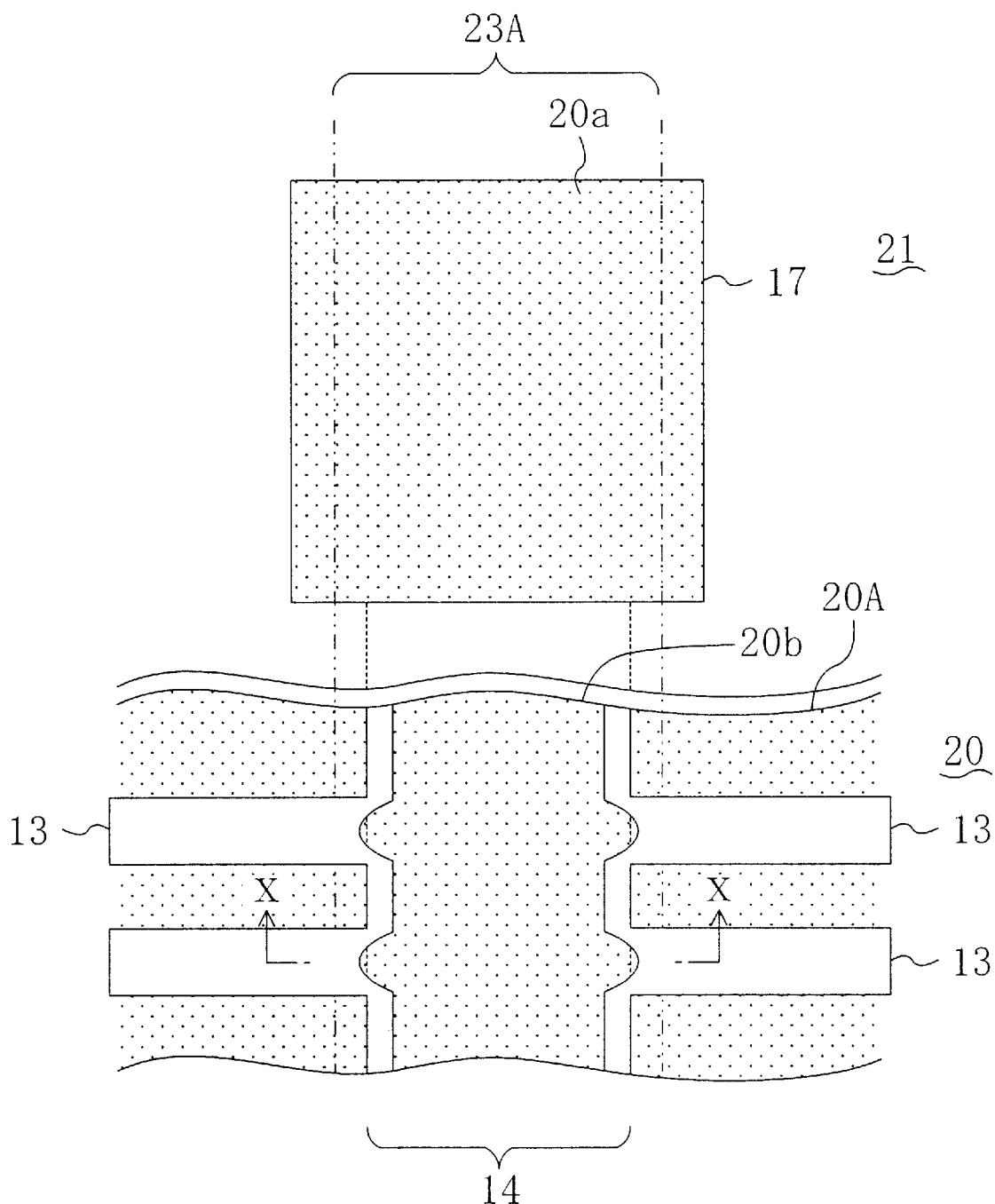
FIG. 9 is a partial bottom view illustrating a cut region of a lead frame according to a variation of one embodiment of the present invention.
Figure 10:
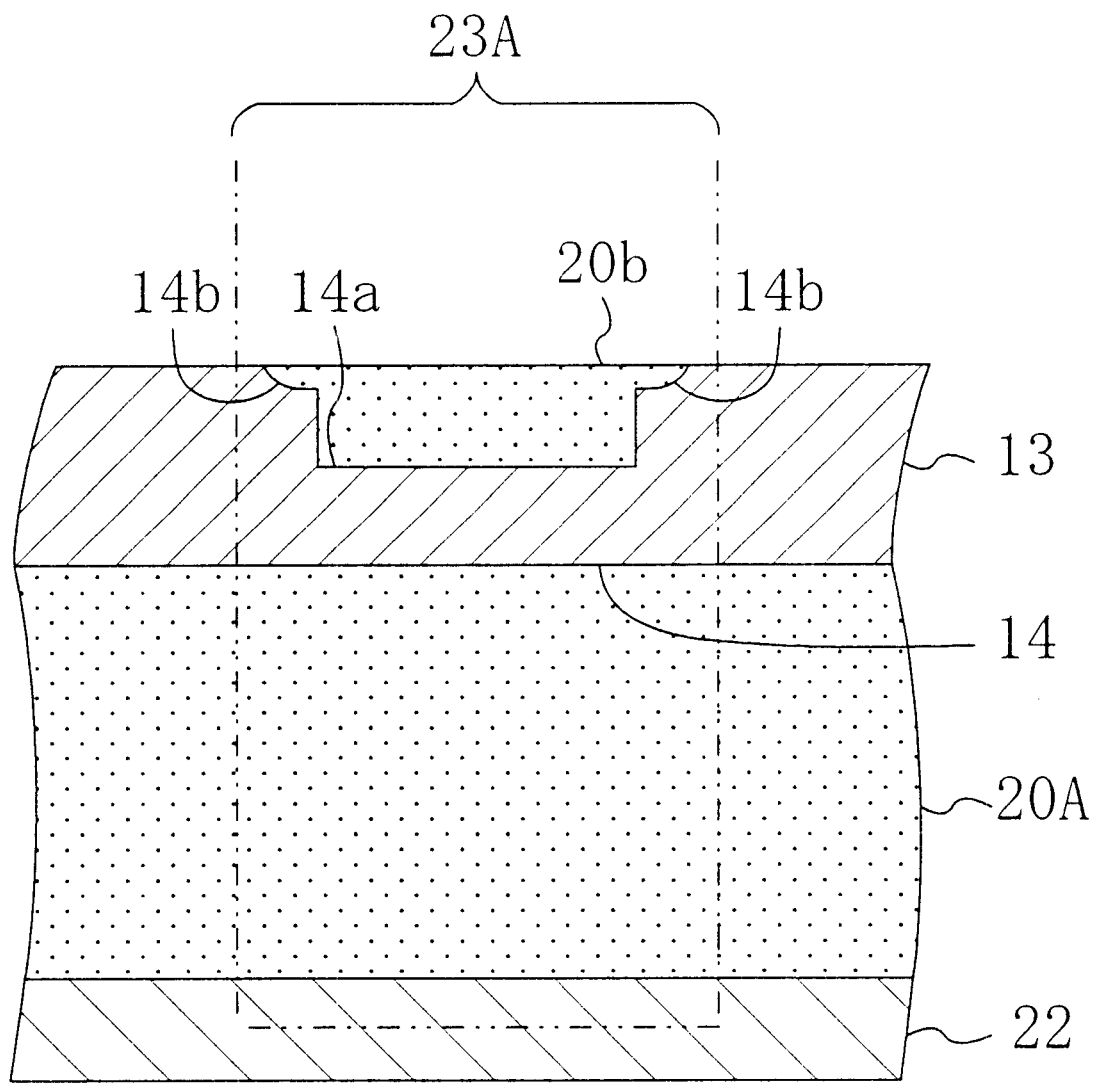
FIG. 10 is a cross-sectional view taken along line X—X of FIG. 9, illustrating a connecting section and an inner lead section.
Figure 11:
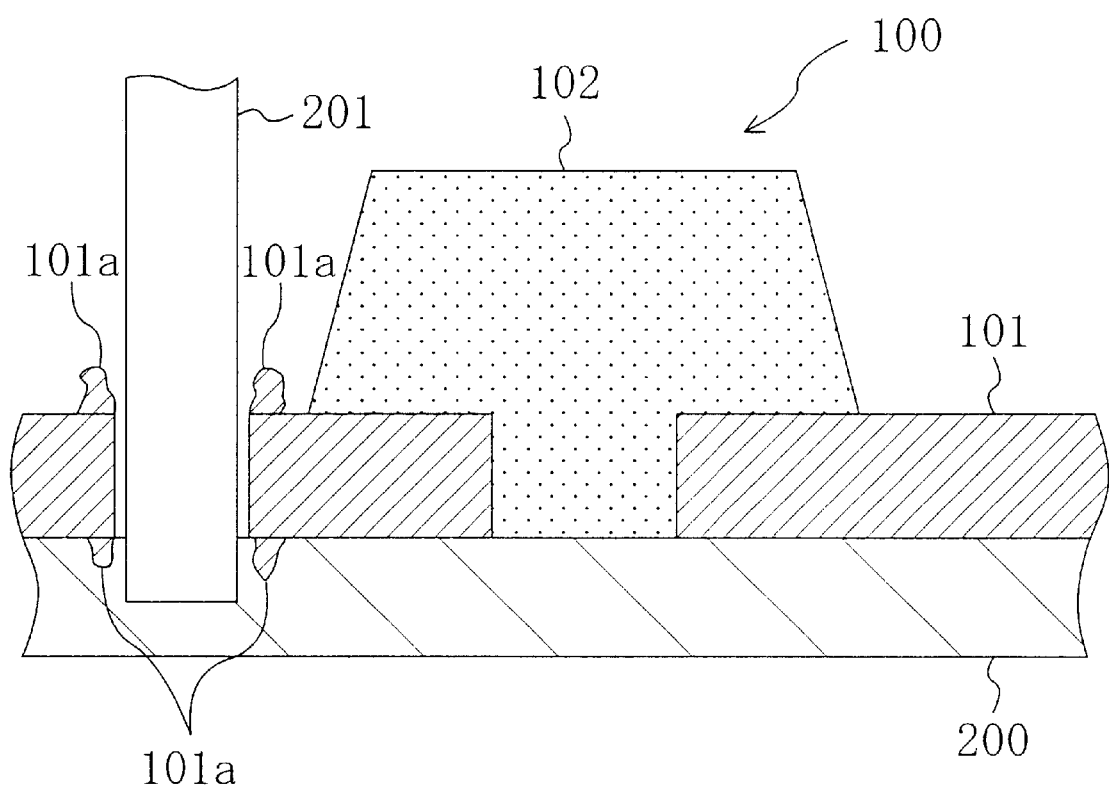
FIG. 11 is a partial cross-sectional view illustrating a semiconductor device separating step in a conventional method for fabricating a resin-encapsulated semiconductor device.

According to a variation of the present embodiment, the connecting section 14 is chamfered to provide a chamfer 14b near each of the inner lead sections 13, as illustrated in FIG. 9 and FIG. 10. As a result of providing the chamfer 14b, the amount of the encapsulation resin 20b to be filled into the depression defined above the thinned portion 14a is increased, thereby reducing the amount of the lead frame 10 to be cut by the cutting blade while increasing the amount of the encapsulation resin 20b to be cut by the cutting blade. This further reduces the burr of the lead frame 10, and further improves the dressing effect on the cutting blade.

What is claimed is:

1. A lead frame, comprising:
   an outer frame section;
   a plurality of chip mounting Sections which are supported by the outer frame section and on which a plurality of semiconductor chips are mounted;
   lead sections surrounding the chip mounting sections; connecting sections for connecting and supporting the lead sections and the outer frame section with each other;
   and an encapsulation region in which the chip mounting sections are encapsulated together in an encapsulation resin, wherein an opening, which planar shape extends in the extension direction of the connecting sections, is provided in a plurality of regions of the outer frame section that are each located outside the encapsulation region and along an extension of one of the connecting sections.

2. The lead frame of claim 1, wherein a width of the opening is greater than a thickness of cutting means for cutting the lead frame along the connecting sections.

3. The lead frame of claim 1, wherein each of the connecting sections includes a thinned portion whose thickness is smaller than a thickness of the outer frame section.

4. The lead frame of claim 1, wherein another opening is provided in a plurality of regions of a peripheral portion of the encapsulation region that are each located along an extension of one of the connecting sections.

5. The lead frame of claim 1, wherein a width of each of the connecting sections is smaller than a thickness of cutting means for cutting the lead frame along the connecting sections.

6. The lead frame of claim 5, wherein each of the connecting sections is chamfered near the lead sections, thereby reducing a thickness of the connecting section near the lead sections.

7. A lead frame, comprising:
   an outer frame section;
   a plurality of chip mounting sections which are supported by the outer frame section and on which a plurality of semiconductor chips are mounted;
   lead sections surrounding the chip mounting sections; connecting sections for connecting and supporting the lead sections and the outer frame section with each other; and an encapsulation region in which the chip mounting sections are encapsulated together in an encapsulation resin, wherein a depressed portion, which planar shape extends in the extension direction of the connecting sections, is provided in a plurality of regions of the outer frame section that are each located outside the encapsulation region, on a reverse side of a runner section along which the encapsulation resin flows, and along an extension of one of the connecting sections.

8. The lead frame of claim 7, wherein a width of the depressed portion is greater than a thickness of cutting means for cutting the lead frame along the connecting sections.

9. The lead frame of claim 7, wherein each of the connecting sections includes a thinned portion whose thickness is smaller than a thickness of the outer frame section.

10. The lead frame of claim 7, wherein another opening is provided in a plurality of regions of a peripheral portion of the encapsulation region that are each located along an extension of one of the connecting sections.

11. The lead frame of claim 7, wherein a width of each of the connecting sections is smaller than a thickness of cutting means for cutting the lead frame along the connecting sections.

12. The lead frame of claim 11, wherein each of the connecting sections is chamfered near the lead sections, thereby reducing a thickness of the connecting section near the lead sections.

13. A lead frame, comprising:

an outer frame section;

a plurality of chip mounting sections which are supported by the outer frame section and on which a plurality of semiconductor chips are mounted;

lead sections surrounding the chip mounting sections; connecting sections for connecting and supporting the lead sections and the outer frame section with each other; and an encapsulation region in which the chip mounting sections are encapsulated together in an encapsulation resin, wherein a plurality of openings is provided in a plurality of regions of the outer frame section that are each located outside the encapsulation region and along an extension of one of the connecting notions.

* * * * *

UNITED STATES PATENT AND TRADEMARK OFFICE
CERTIFICATE OF CORRECTION

PATENT NO.    : 6,603,194 B2
DATED         : August 5, 2003
INVENTOR(S)   : Masaki Utsumi et al.

It is certified that error appears in the above-identified patent and that said Letters Patent is hereby corrected as shown below:

Title page,
Item [30], Foreign Application Priority Data, delete "2000-038220" and add -- 2001-038220 --;

Signed and Sealed this

Twenty-ninth Day of June, 2004

JON W. DUDAS
*Acting Director of the United States Patent and Trademark Office*